United States Patent [19]

Warfield

[11] Patent Number: 5,512,163

[45] Date of Patent: Apr. 30, 1996

[54] METHOD FOR FORMING A PLANARIZATION ETCH STOP

[75] Inventor: Timothy J. Warfield, Tempe, Ariz.

[73] Assignee: Motorola, Inc., Schaumburg, Ill.

[21] Appl. No.: 221,591

[22] Filed: Apr. 1, 1994

Related U.S. Application Data

[62] Division of Ser. No. 894,978, Jun. 8, 1992, abandoned.

[51] Int. Cl.$^6$ .................. C25D 15/00; H01L 21/463; H01L 21/465
[52] U.S. Cl. .................. 205/109; 205/123; 437/228; 437/230; 437/245; 437/246
[58] Field of Search .................. 205/109, 110, 205/123; 437/228, 245, 246, 230, 243

[56] References Cited

U.S. PATENT DOCUMENTS

| | | | |
|---|---|---|---|
| 3,666,636 | 5/1972 | Tomaszewski et al. | 205/109 |
| 3,691,707 | 9/1972 | Von Arx et al. | 51/295 |
| 3,762,882 | 10/1973 | Grutza | 428/615 |
| 4,155,721 | 5/1979 | Fletcher | 51/295 |
| 4,789,648 | 12/1988 | Chow et al. | 437/225 |
| 4,879,258 | 11/1989 | Fisher | 437/225 |
| 5,246,884 | 9/1993 | Jaso et al. | 437/225 |
| 5,272,117 | 12/1993 | Roth | 437/225 |

OTHER PUBLICATIONS

J. P. Celis et al, Kinetics of the Deposition of Alumina Particles from Copper Sulfate Plating Baths, *J. Electrochem Soc.*, l vol. 124, No. 10, Oct. 1977, pp. 1508–1511.
F. A. Lowenheim, Electroplating, McGraw–Hill Book Co., New York, 1978, pp. 194–205.
V. Comello (ed.), Planarizing Leading Edge Devices, Semiconductor International, Nov. 1990, pp. 60–66.
P. Sinter (ed.), Searching for Perfect Planarity, Semiconductor International, Mar. 1992, pp. 44–48.

*Primary Examiner*—John Niebling
*Assistant Examiner*—William T. Leader
*Attorney, Agent, or Firm*—Bernard Berman

[57] ABSTRACT

A method for stopping a polish planarization wherein an etch-stop layer (13, 21, 31) is formed. The etch-stop layer (13, 21, 31) may be formed on a substrate (11) or on a conductive layer (12). The etch-stop layer (13, 21, 31) includes a metal and a grit material (17, 25, 35) such as a diamond powder. The etch-stop layer (13, 21, 31) serves as a stop to a mechanical polishing apparatus. The mechanical polishing apparatus removes a planarization layer (14, 22, 33) by polishing, but is unable to remove the etch-stop layer (13, 21, 31) because the etch-stop layer is able to withstand a polishing action of the mechanical polishing apparatus. The etch-stop layer (13, 21, 31) provides protection for the metal from mechanical damage during polish planarization and allows formation of a planar surface.

18 Claims, 1 Drawing Sheet

METHOD FOR FORMING A PLANARIZATION ETCH STOP

This is a division of application Ser. No. 07/894,978, filed Jun. 8, 1992, now abandoned.

BACKGROUND OF THE INVENTION

This invention relates, in general, to a method for planarizing a surface and, more particularly, to a method for stopping a surface planarization step.

In general, an integrated circuit fabrication technique produces a device having a non-planar surface topography. The non-planar surface topography may create a discontinuity in a film on the surface of the device. A subsequent film formed over the discontinuity may break during a thermally or mechanically stressful fabrication step. In addition, for a device having small feature sizes, a depth of focus of a photolithographic stepper becomes very small and a precise focus is difficult to achieve. Thus, a resolution of the photolithographic stepper is limited.

Typically, manufacturers of integrated circuit devices include a planarization step in the fabrication technique. One planarization method employed by integrated circuit manufacturers is a mechanical polishing technique. In the mechanical polishing technique, a non-planar surface is polished or etched by application of a frictional abrasive to the non-planar surface. Although a planar surface is obtained, this technique suffers from a lack of an adequate method to stop the planarization step before too much surface material is removed from the integrated circuit. Current approaches for stopping a polishing step are expensive and diminish a number of devices manufactured per unit time, commonly referred to as a throughput. Accordingly, it would be advantageous to have a low cost means for stopping a polishing step that is readily implemented in integrated circuit fabrication techniques and that allows a high throughput.

SUMMARY OF THE INVENTION

Briefly stated, the present invention is a method for forming a polish planarization etch-stop layer. A structure having a first major surface is provided. A first layer is formed on the first major surface wherein the first layer comprises a metal and a grit material. The grit material serves as the planarization etch stop.

DETAILED DESCRIPTION OF THE DRAWINGS

Typically, semiconductor integrated circuit manufacturers include surface planarization steps in their integrated circuit fabrication techniques. A common semiconductor integrated circuit planarization method includes an abrasive step to etch or polish a surface of the integrated circuit, thereby planarizing the surface and forming a planarized monolithic semiconductor integrated circuit. The abrasive step may be chem-mechanical or mechanical. A limitation of this planarization method is a lack of a planarization etch-stop which may permit removal of too much of a surface material. A solution to this problem is described in the present invention.

Figure 1:
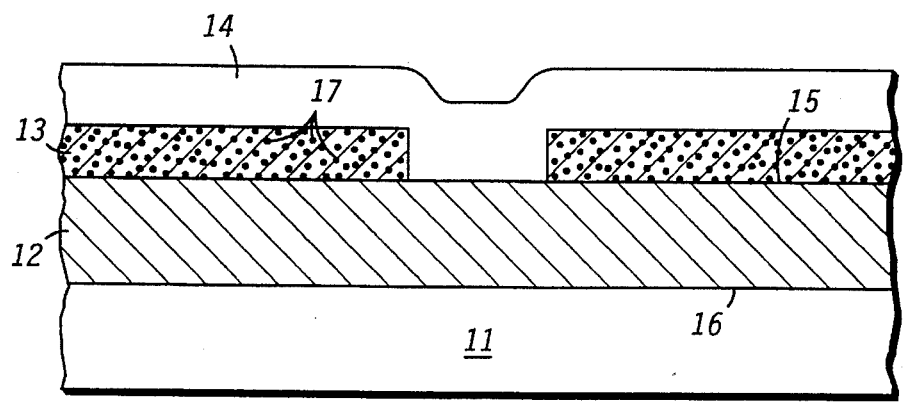
FIG. 1 illustrates a highly enlarged cross-sectional side view of a portion of a first embodiment of the present invention.

FIG. 1 shows a portion of a monolithic semiconductor integrated circuit 10 having a substrate 11 with a series of layers disposed thereon. The layers disposed on substrate 11 include a conductive layer 12, an etch-stop layer 13, and a planarization layer 14. It shall be understood that etch-stop layer 13 serves as a conductive layer having a grit material capable of stopping the chem-mechanical or the mechanical polish planarization step. Preferably, a thickness of conductive layer 12 is approximately 90% of a sum of the thicknesses of layers 12 and 13. Planarization layer 14 may be, for example, an oxide; although any suitable dielectric material may form planarization layer 14.

Although monolithic semiconductor integrated circuit 10 shown in FIG. 1 has the single conductive layer 12, it shall be understood that there may be more than one conductive layer 12 and more than one etch-stop layer 13 disposed on substrate 11. Thus a structure having a plurality of conductive layers 12 and etch-stop layers 13 may be planarized wherein each successive etch-stop layer 13 is coated with a planarization layer. Preferably each planarization layer is planarized using the chem-mechanical or the mechanical polish planarization step.

The use of more than one conductive layer creates a greater non-planar surface topography than having the single conductive layer 12, thereby increasing a requirement for an integrated circuit planarization technique. FIG. 1, illustrating a single conductive layer 12 and a single etch-stop layer 13 is for explanatory purposes only and is not a limitation of the present invention.

Non-planar planarization layer 14 is polished using a mechanical polishing apparatus (not shown), thereby planarizing planarization layer 14. The polishing of planarization layer 14 employs frictional abrasion to remove non-planar portions of planarization layer 14 that are in contact with a mechanical polishing apparatus. The polishing and removal of planarization layer 14 continues until etch-stop layer 13 is encountered. Thus, etch-stop layer 13 serves as a positive polish stop. Further, a remaining portion of planarization layer 14 is rendered planar with etch-stop layer 13. Although a mechanical polishing apparatus is discussed, it shall be understood that a polishing apparatus may be a chem-mechanical polishing apparatus.

Etch-stop layer 13 comprises a metal and a grit material 17 and serves as a planarization etch-stop. Grit material 17 is illustrated in FIG. 1 as a plurality of specks 17 within etch-stop layer 13. Grit material 17 of etch-stop layer 13 is harder than the metal and prevents the mechanical polishing apparatus from grinding through etch-stop layer 13. Preferably, the grit material is a diamond powder such as, for example, a micropolycrystalline diamond powder sold under the trademark "MYPOLEX".

It shall be understood that a type of material for grit material 17 is not a limitation of the present invention. Grit material 17 may be any suitable material that is harder than the metal such as aluminum oxide granules, silicon dioxide granules, aluminum silicate granules, or the like. In other words, grit material 17 may be any suitable material capable of withstanding grinding by the mechanical polishing apparatus. Although the presence of grit material 17 renders an electrical conductivity of etch-stop layer 13 less than the electrical conductivity of conductive layer 12, it shall be understood that etch-stop layer 13 is electrically conductive.

In a first embodiment, as illustrated in FIG. 1, formation of conductive layer 12 and etch-stop layer 13 occur as follows. Conductive layer 12 having a major surface 15 is formed by electroplating a metal on a portion of a major surface 16 of substrate 11. Preferably, substrate 11 is placed in an electroplating system (not shown) containing a first electroplating solution. Preferably, conductive layer 12 comprises copper and etch-stop layer 13 comprises copper and diamond powder as grit material 17. Further, the electroplating solution comprises copper sulfate in a concentration of approximately 256 grams per liter and sulfuric acid in a concentration of approximately 40 grams per liter. Preferably, a temperature of the electroplating solution is approximately 40° C. A current bias is applied through the first electroplating system wherein the current bias is approximately 0.05 amps per square centimeter. The current bias is applied for approximately three minutes producing conductive layer 12 having a thickness of approximately 4,500 angstroms.

Substrate 11 having conductive layer 12 is removed from the first electroplating system and placed in a second electroplating system (not shown) containing an etch-stop electroplating solution. The etch-stop electroplating solution comprises copper sulfate in a concentration of approximately 256 grams per liter, sulfuric acid in a concentration of approximately 40 grams per liter, and a grit material having a concentration of approximately 1 gram per liter. The second electroplating system may have a stirring or agitation device to keep the grit material in suspension. Preferably, the grit material is diamond powder having a diameter of approximately 0.25 micron, and a temperature of the electroplating solution is approximately 40° C. A current bias is applied through the second electroplating system wherein the current bias is approximately 0.05 amps per square centimeter. The current bias is applied for approximately 30 seconds producing etch-stop layer 13 having a thickness of approximately 500 angstroms. Thus etch-stop layer 13 comprises a copper metal and a diamond powder.

It shall be understood that electroplating parameters of current density, duration of current density, a size of the grit material, and temperature and concentration of the components of the electroplating solutions discussed previously merely serve as examples and are not limitations of the present invention. These parameters may be selected as a function of a desired thickness of conductive layer 12 and etch-stop layer 13. Conductive layer 12 may have a thickness ranging from approximately 3,000 angstroms to 50,000 angstroms, and etch-stop layer 13 may have a thickness ranging from 100 angstroms to 5,000 angstroms. The thicknesses of conductive layer 12 and etch-stop layer 13 are a function of their levels when implemented in a monolithic semiconductor integrated circuit having a multi-level metallization scheme. It shall be further understood that a type of conductive material for layers 12 and 13 is not a limitation of the present invention. The type of conductive material may be any suitable metal that can be formed by electroplating such as aluminum, nickel, or the like.

Figure 2:
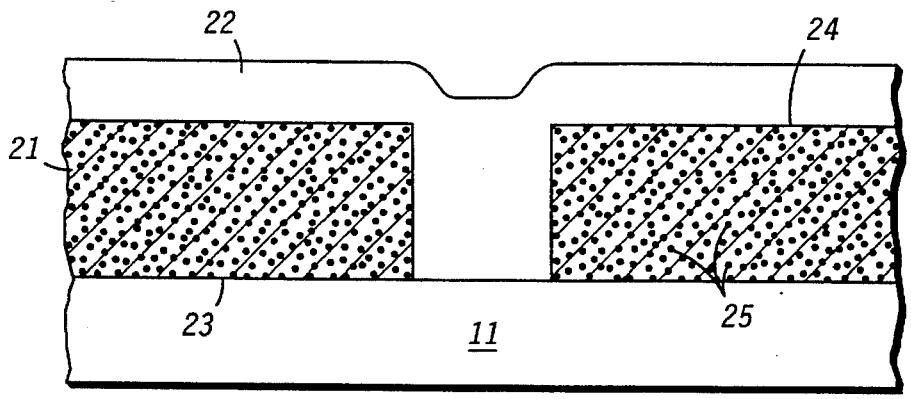
FIG. 2 illustrates a highly enlarged cross-sectional side view of a portion of a second embodiment of the present invention.

In a second embodiment of the present invention, as shown in FIG. 2, a portion of a monolithic integrated circuit 20 has a substrate 11 with a series of layers disposed thereon. The layers disposed on substrate 11 include an etch-stop layer 21 having a grit material 25, and a planarization layer 22. Grit material 21 is illustrated in FIG. 2 as a plurality of specks 25. Etch-stop layer 21 is an electrically conductive layer and also serves as an etch-stop layer for the mechanical polishing step. Etch-stop layer 21 is electroplated on a major surface 23 of substrate 11 in an electroplating system having an etch-stop electroplating solution. The electroplating system, the etch-stop electroplating solution, and the electroplating parameters of current density and temperature are as described for the second electroplating system as discussed previously for etch-stop layer 13 of FIG. 1. Preferably the current bias is applied for approximately 3.5 minutes thereby forming etch-stop layer 21 having a thickness of approximately 5,000 angstroms.

Etch-stop layer 21 may be patterned using techniques well known to those of skill in the art to expose portions of substrate 11. Planarization layer 22 is formed on a major surface 24 of etch-stop layer 21 and the exposed portions of substrate 11. Planarization layer 22 and etch-stop layer 21 are non-planar. Planarization layer 22 may be any suitable dielectric such as silicon dioxide, silicon nitride, oxide, or the like. Planarization layer 22 is polished by the mechanical polishing apparatus until conductive layer 21 is encountered. Because of the presence of the grit material, stopping layer 21 inhibits further removal of planarization layer 22 by polishing thereby leaving a planar surface and serving as a polish planarization etch-stop.

Figure 3:
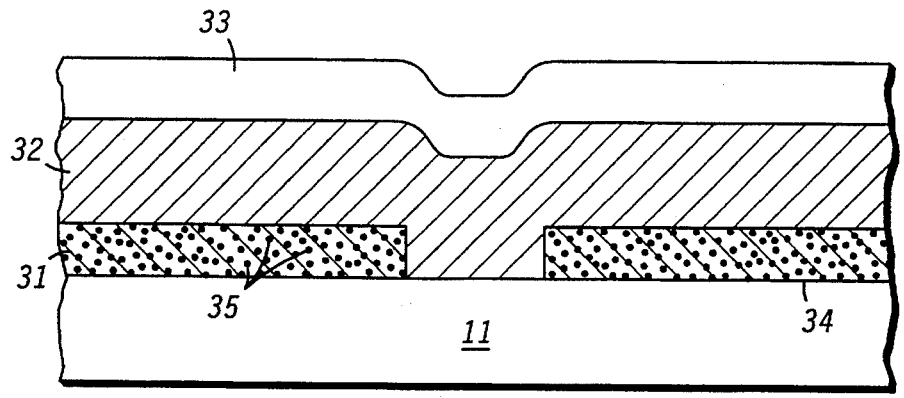
FIG. 3 illustrates a highly enlarged cross-sectional side view of a portion of a third embodiment of the present invention.

A third embodiment of the present invention, as shown in FIG. 3, includes a portion of a monolithic integrated circuit 30 having a substrate 11 having a major surface 34 with a series of layers disposed thereon. The series of layers includes an etch-stop layer 31, a conductive layer 32, and a planarization layer 33. Etch-stop layer 31 is an electrically conductive layer and also serves as an etch-stop layer for the mechanical polishing step. Etch-stop layer 31 includes a grit material 35 as shown by the the plurality of specks within etch-stop layer 31.

Etch-stop layer 31 is electroplated on a major surface 34 of substrate 11 in an electroplating system having an etch-stop electroplating solution. The electroplating system, the etch-stop electroplating solution, and the electroplating parameters of current density and temperature are as described for the second electroplating system as discussed previously for etch-stop layer 13 of FIG. 1. Etch-stop layer 31 may be patterned using techniques well known to those of skill in the art to expose portions of substrate 11. Conductive layer 32 is electroplated on stopping layer 31 and exposed portions of substrate 11. Conductive layer 32 may be formed by the technique and electroplating parameters as described for conductive layer 12 of the first embodiment of FIG. 1.

A planarization layer 33 is formed over conductive layer 32. Planarization layer 33 may be any suitable dielectric such as silicon dioxide, silicon nitride, oxide, or the like. Planarization layer 33 and conductive layer 32 are polished using the mechanical polishing apparatus (not shown). The step of polishing is stopped when the mechanical polishing apparatus encounters etch-stop layer 31, thereby forming a planar surface comprising portions of etch-stop layer 31 and conductive layer 32.

By now it should be appreciated that there has been provided a method for forming a planarization etch-stop capable of stopping a chem-mechanical or a mechanical polishing planarization step. The method comprises forming a layer of metal having a grit material which stops the polishing action of the chem-mechanical or the mechanical polishing apparatus. The grit material is harder than the metal, thus is capable of withstanding a grinding action of the chem-mechanical or the mechanical polishing apparatus.

Further, the method is low cost and readily implemented in integrated circuit fabrication techniques.

I claim:

1. A method for forming a planarization etch-stop, comprising the steps of:

providing a monolithic integrated circuit having at least one conductive layer on the surface thereof; and forming a planarization etch-stop layer on a portion of the at least one conductive layer, the planarization etch-stop layer comprising a metal and a grit material, wherein the planarization etch-stop layer serves as an etch-sto for one of a chem-mechanical or mechanical etch.

2. A method for forming a planarization etch-stop as claimed in claim 1, wherein the step of forming the planarization etch-stop layer comprises using an electroplating technique to form the planarization etch-stop layer.

3. A method for forming a planarization etch-stop as claimed in claim 2, wherein the step of using an electroplating technique to form the planarization etch-stop layer includes using an electroplating solution comprising copper sulfate, sulfuric acid, and the grit material.

4. A method for forming a planarization etch-stop as claimed in claim 3, wherein the step of using an electroplating solution comprising copper sulfate, sulfuric acid, and the grit material further comprises providing the copper sulfate in a concentration of approximately 256 grams per liter of electroplating solution, providing the sulfuric acid in a concentration of approximately 40 grams per liter of electroplating solution, and providing the grit material in a concentration of approximately 1 gram per liter of electroplating solution.

5. A method for forming a planarization etch-stop as claimed in claim 1, wherein the step of forming the planarization etch-stop layer comprises using copper as the metal and diamond powder as the grit material.

6. A method for forming a planarization etch-stop as claimed in claim 1, wherein the step of forming a planarization etch-stop layer comprises using copper as the metal for the planarization etch-stop layer and selecting the grit material from the group consisting of aluminum oxide granules, silicon dioxide granules, and aluminum silicate granules.

7. A method for planarizing a monolithic semiconductor integrated circuit, comprising the steps of:

providing the monolithic semiconductor integrated circuit;

forming an etch-stop layer on a portion of the monolithic semiconductor integrated circuit, the etch-stop layer comprising a metal and a grit material;

forming a planarization layer on the etch-stop layer; and planarizing the planarization layer using one of a chem-mechanical or a mechanical polish step.

8. The method of claim 7, wherein the step of forming an etch-stop layer includes providing copper as the metal and diamond powder as the grit material.

9. The method of claim 7, wherein the step of forming an etch-stop layer includes providing copper as the metal and selecting the grit material from the group consisting of aluminum oxide granules, silicon dioxide granules, and aluminum silicate granules.

10. The method of claim 7, wherein the step of forming a planarization layer includes forming the planarization layer as a layer of oxide.

11. The method of claim 7, further comprising the step of forming a conductive layer on the etch-stop layer prior to forming the planarization layer, wherein the conductive layer is formed of a metal and the planarization layer is formed of a dielectric material.

12. The method of claim 7, wherein the step of forming the planarization layer includes forming the planarization layer as a layer of silicon dioxide or silicon nitride.

13. The method of claim 7, wherein the step of planarizing the planarization layer includes terminating the step of planarizing when the planarization layer is coplanar with the etch-stop layer.

14. A method for planarizing a monolithic semiconductor integrated circuit, comprising the steps of:

providing the monolithic semiconductor integrated circuit;

providing a first electroplating solution, the first electroplating solution comprising a metal;

electroplating a first conductive layer on a portion of the monolithic semiconductor integrated circuit;

providing a second electroplating solution, the second electroplating solution comprising the metal and a grit material;

electroplating a second conductive layer on at least a portion of the first conductive layer, the second conductive layer comprising the metal and the grit material;

forming a planarization layer on the second conductive layer; and planarizing the planarization layer, wherein the step of planarizing the planarization layer is stopped when the second conductive layer is encountered.

15. The method of claim 14, wherein the step of providing the second electroplating solution includes selecting the grit material from the group consisting of diamond powder, aluminum oxide granules, silicon dioxide granules, and aluminum silicate granules.

16. The method of claim 14, wherein the step of planarizing the planarization layer includes grinding the planarization layer.

17. The method of claim 14, wherein the step of planarizing the planarization layer includes performing the step of planarizing using a chem-mechanical technique.

18. The method of claim 14, wherein the step of providing a first electroplating solution includes forming the first electroplating solution as a solution comprising copper sulfate and sulfuric acid.

* * * * *